(12) United States Patent
Minotto et al.

(10) Patent No.: US 11,653,514 B2
(45) Date of Patent: May 16, 2023

(54) LIGHT-EMITTING DEVICE INCLUDING MIXTURES OF DIFFERENT QUANTUM DOTS

(71) Applicant: SHARP KABUSHIKI KAISHA, Sakai (JP)

(72) Inventors: Alessandro Minotto, London (GB); Valerie Berryman-Bousquet, Chipping Norton (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 102 days.

(21) Appl. No.: 17/323,308

(22) Filed: May 18, 2021

(65) Prior Publication Data
US 2022/0376196 A1   Nov. 24, 2022

(51) Int. Cl.
*H01L 51/50* (2006.01)
*H01L 51/00* (2006.01)
*H01L 27/32* (2006.01)

(52) U.S. Cl.
CPC ........ *H01L 51/502* (2013.01); *H01L 27/3206* (2013.01); *H01L 51/0003* (2013.01); *H01L 51/5056* (2013.01); *H01L 51/5072* (2013.01)

(58) Field of Classification Search
CPC ........................... H01L 51/502; H01L 27/3206
See application file for complete search history.

(56) References Cited

U.S. PATENT DOCUMENTS

| 10,581,007 B2 | 3/2020 | Angioni et al. |
| 10,700,236 B2 | 6/2020 | Steckel et al. |
| 10,826,011 B1 | 11/2020 | Angioni et al. |
| 2017/0084776 A1* | 3/2017 | Gessner .............. H01L 27/3227 |
| 2020/0168826 A1 | 5/2020 | You |

FOREIGN PATENT DOCUMENTS

CN   111416053 A   7/2020

OTHER PUBLICATIONS

Doe-Sullivan et al., "Large-Area Ordered Quantum-Dot Monolayers via Phase Separation During Spin-Casting", Adv. Funct. Mater., 2005, pp. 1117-1124, vol. 15.
Dai et al., "Solution-processed, high-performance light-emitting diodes based on quantum dots," Nature, Nov. 6, 2014, pp. 96-110, vol. 515.
Zhang et al., "Suppressing Förster Resonance Energy Transfer in Close-Packed Quantum-Dot Thin Film: Toward Efficient Quantum-Dot Light-Emitting Diodes with External Quantum Efficiency over 21.6%," Adv. Optical Mater., 2020, n. 1902092.

* cited by examiner

*Primary Examiner* — Anthony Ho
(74) *Attorney, Agent, or Firm* — ScienBiziP, P.C.

(57) ABSTRACT

A light-emitting device is provided. The light-emitting device includes an anode, a cathode, and a combined charge transport and emissive layer (CCTEL) disposed between the anode and the cathode. The CCTEL includes a crosslinked charge transport material, a first plurality of quantum dots having a first energy gap, and a second plurality of quantum dots having a second energy gap wider than the first energy gap.

20 Claims, 11 Drawing Sheets

LIGHT-EMITTING DEVICE INCLUDING MIXTURES OF DIFFERENT QUANTUM DOTS

FIELD

The present disclosure generally relates to light-emitting devices (LEDs) and in particular relates to LEDs incorporating an emitting layer including a mixture of different quantum dots. Such LEDs may be integrated in display applications, such as high-resolution multicolor displays.

BACKGROUND

A conventional architecture for a light-emitting device may include an anode, acting as hole injection electrode; a hole transport layer (HTL) disposed on the anode; an emissive material layer (EML) disposed on the HTL; an electron transport layer (ETL) disposed on the EML; and a cathode, which also acts as an electron injection electrode, disposed on the ETL. When a forward bias voltage is applied across the anode and cathode of this architecture, holes and electrons are transported in the device through the HTL and ETL, respectively. The holes and electrons then recombine in the EML, which causes emission of light.

When the EML includes an organic semiconductor, the light-emitting device is typically referred to as an organic light-emitting diode (OLED). When the EML includes semiconducting nanocrystals, sometimes known as quantum dots (QDs), the device is commonly called either a quantum dot light-emitting diode (QLED or QD-LED) or an electroluminescent quantum dot light-emitting diode (ELQLED).

Generally, QDs employed in QLEDs include ligands bound to their surface. The ligands may be employed to passivate the QD surface and enable deposition of the QDs via solution process techniques. Solution process methods allow inexpensive large-scale deposition and are thus preferable to more complex and costly thermal evaporation methods commonly used for OLEDs. However, for the fabrication of a multicolor high-resolution display based on arrays of QLEDs, three different types of electroluminescent QDs emitting red (R), green (G), and blue (B) light are deposited on three different regions of a substrate to form R, G, and B sub-pixels. To enable the selective deposition of QLEDs in a patterned sub-pixel arrangement, an emissive layer including QDs that are dispersed in a crosslinked matrix based on one or more cross-linkable materials has been proposed. If the cross-linkable material includes a charge transport material, the blended layer may form a combined charge transport and emissive layer (CCTEL).

Besides offering ease of patternability, the dispersion of QDs in a matrix may lead to improved QLED performance. For example, the matrix may facilitate balanced charge injection inside the QD emitters, act as a passivating agent for QD surface defects (e.g., originating from uneven ligand coverage), and/or offer protection from exciton quenching agents, such as reactive oxygen species. Furthermore, the dispersion of QDs in a medium with a wider energy gap may prevent inter-dot resonant energy transfer (RET), thereby reducing the probability of exciton transfer from an emissive QD to defective or poorly emissive QDs.

QD distribution within a CCTEL, however, is typically not uniform because the QDs tend to phase-segregate from the matrix and form self-assembled QD "islands" on the upper outer surface of the layer, thus possibly defeating the advantages often associated with a CCTEL. This phase segregation may originate from the different chemical functionalities, sizes, and shapes between the blend components (e.g., the QDs and the matrix) and is driven by the minimization of surface energy.

SUMMARY

The present disclosure is directed to a light-emitting device that includes a mixture of different quantum dots.

In accordance with one aspect of the present disclosure, a light-emitting device may include an anode, a cathode, and a combined charge transport and emissive layer (CCTEL) disposed between the anode and the cathode. The CCTEL may include a crosslinked charge transport material, a first plurality of quantum dots having a first energy gap, and a second plurality of quantum dots having a second energy gap wider than the first energy gap.

In an implementation of the first aspect, a difference between the first energy gap and the second energy gap may result in a majority of light from the light-emitting device being emitted from the first plurality of quantum dots relative to the second plurality of quantum dots. In another implementation of the first aspect, the first plurality of quantum dots may include first surface ligands, and the second plurality of quantum dots may include second surface ligands different from the first surface ligands. In an implementation of the first aspect, the first plurality of quantum dots may have a first shape and a first size, the second plurality of quantum dots may have a second shape and a second size, and at least one of the second shape may be different than the first shape, or the second size may be different than the first size.

In another implementation of the first aspect, the first plurality of quantum dots and the second plurality of quantum dots may be phase-segregated from the crosslinked charge transport material toward a portion of the CCTEL closest to the cathode. Further, in some examples, the second plurality of quantum dots may be more highly concentrated in a sub-portion of the portion of the CCTEL closer to the cathode than the first plurality of quantum dots.

In another implementation of the first aspect, the first plurality of quantum dots and the second plurality of quantum dots may be phase-segregated from the crosslinked charge transport material toward a portion of the CCTEL closest to the anode. Moreover, in some examples, the first plurality of quantum dots may be more highly concentrated in a sub-portion of the portion of the CCTEL closer to the anode than the second plurality of quantum dots.

In another implementation of the first aspect, the first plurality of quantum dots and the second plurality of quantum dots may be evenly distributed in a monolayer at an outer surface of the CCTEL closest to the cathode. In yet another implementation of the first aspect, the first plurality of quantum dots and the second plurality of quantum dots may be evenly distributed in a monolayer at an outer surface of the CCTEL closest to the anode.

In another implementation of the first aspect, the crosslinked charge transport material may include a hole transport material. Alternatively, the crosslinked charge transport material may include an electron transport material.

In another implementation of the first aspect, the light-emitting device may include a hole transport layer disposed between the anode and the CCTEL. In yet another implementation of the first aspect, the light-emitting device may include an electron transport layer disposed between the cathode and the CCTEL.

In another implementation of the first aspect, the crosslinked charge transport material may include a photo-crosslinkable material, and the photo-cross-linkable material may become crosslinked when subjected to an activation stimulus including exposure to ultraviolet (UV) light.

In accordance with a second aspect of the present disclosure, a light-emitting device array may include a plurality of light-emitting devices, and an insulating material that separates at least a portion of each of the plurality of light-emitting devices from others of the plurality of light-emitting devices. At least one of the plurality of light-emitting devices may include an anode, a cathode, and a combined charge transport and emissive layer (CCTEL) disposed between the anode and the cathode. The CCTEL may include a crosslinked charge transport material, a first plurality of quantum dots having a first energy gap, and a second plurality of quantum dots having a second energy gap wider than the first energy gap. A first of the plurality of light-emitting devices may be configured to emit light of a first color, and a second of the plurality of light-emitting devices may be configured to emit light of a second color different from the first color.

In accordance with a third aspect of the present disclosure, a method for creating a combined charge transport and emissive layer (CCTEL) for a light-emitting device may include depositing a solution over an underlayer of the light-emitting device. The underlayer may include an electrode. The solution may include a cross-linkable charge transport material, a first plurality of quantum dots having a first energy gap, and a second plurality of quantum dots having a second energy gap wider than the first energy gap. The method may further include applying an activation stimulus to the cross-linkable charge transport material to create a crosslinked charge transport matrix carrying the first plurality of quantum dots and the second plurality of quantum dots.

In an implementation of the third aspect, the activation stimulus may include light. In another implementation of the third aspect, the first plurality of quantum dots and the second plurality of quantum dots may be phase-segregated from the crosslinked charge transport matrix toward a portion of the CCTEL closest to the electrode. Alternatively, in another implementation of the third aspect, the first plurality of quantum dots and the second plurality of quantum dots may be phase-segregated from the crosslinked charge transport matrix toward a portion of the CCTEL farthest from the electrode.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

DESCRIPTION

Figure 1B:
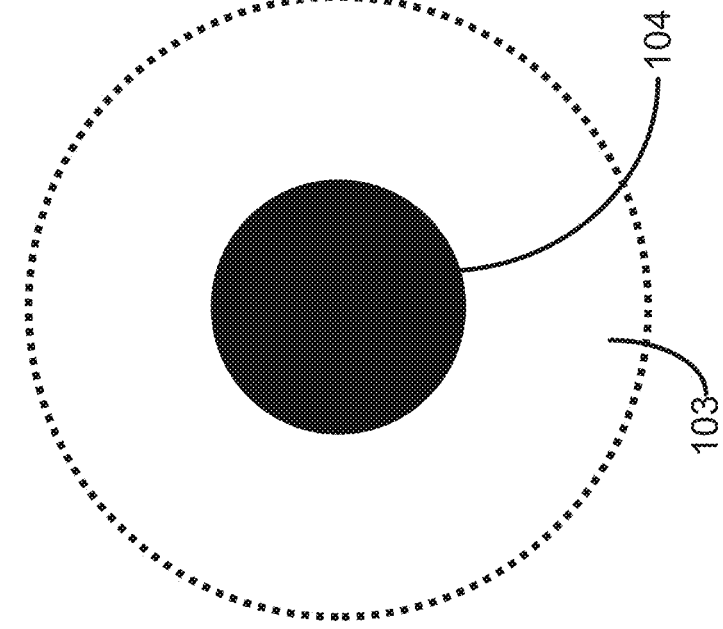
FIGS. 1A and 1B are schematic cross-sectional views of conventional quantum dots, including a shell and ligands, in accordance with example implementations of the present disclosure.

The following description contains specific information pertaining to exemplary implementations in the present disclosure. The drawings and their accompanying detailed description are directed to exemplary implementations. However, the present disclosure is not limited to these exemplary implementations. Other variations and implementations of the present disclosure will occur to those skilled in the art. Unless noted otherwise, like or corresponding elements in the figures may be indicated by like or corresponding reference numerals. Moreover, the drawings and illustrations are generally not to scale and are not intended to correspond to actual relative dimensions.

For consistency and ease of understanding, like features are identified (although, in some examples, not shown) by numerals in the exemplary figures. However, the features in different implementations may be different in other respects, and therefore will not be narrowly confined to what is shown in the figures.

The phrases "in one implementation" and "in some implementations" may each refer to one or more of the same or different implementations. The term "coupled" is defined as connected, whether directly or indirectly via intervening components, and is not necessarily limited to physical connections. The term "comprising" means "including, but not necessarily limited to" and specifically indicates open-ended inclusion or membership in the described combination, group, series, and equivalent.

Additionally, any two or more of the following paragraphs, (sub)-bullets, points, actions, behaviors, terms, alternatives, examples, or claims described in the following disclosure may be combined logically, reasonably, and properly to form a specific method. Any sentence, paragraph, (sub)-bullet, point, action, behavior, term, or claim described in the following disclosure may be implemented independently and separately to form a specific method. Dependency, e.g., "according to", "more specifically", "preferably", "in one embodiment", "in one implementation", "in one alternative", etc., in the following disclosure refers to just one possible example which would not restrict the specific method.

For explanation and non-limitation, specific details, such as functional entities, techniques, protocols, and standards, are set forth for providing an understanding of the described technology. In other examples, detailed discussions of well-known methods, technologies, systems, and architectures are omitted so as not to obscure the description with unnecessary details.

Also, while certain directional references (e.g., top, bottom, up, down, height, width, and so on) are employed in the description below and appended claims, such references are utilized to provide guidance regarding the positioning and dimensions of various elements relative to each other and are not intended to limit the orientation of the various embodiments to those explicitly discussed herein.

Embodiments described herein provide a new light-emitting device structure with one or more light-emitting elements, or sub-pixels (e.g., potentially arranged as R, G, and B sub-pixels of a pixel), with each sub-pixel incorporating a combined charge transport and emissive layer (CCTEL) based on a blend of QDs and a charge transport matrix. In various embodiments described below, at least one sub-pixel may contain two different populations of QDs that may differ by one or more of composition, energy gap (and, hence, emission color), frontier energy level, size, shape, and/or surface ligands. This doubly doped CCTEL configuration may provide improved efficiency, stability, and ease of fabrication with respect to conventional multilayer device configurations, provided that the relative distribution of each QD population within the CCTEL may be controlled.

Control over the arrangement of the QDs inside the CCTEL may be obtained by leveraging QD phase segregation (or phase separation) towards an outer surface of the layer. QD phase segregation in matrices is primarily driven by two factors: the minimization of interface surface energy, and the disparity of chemical functionality between the QD ligands and the matrix. Therefore, by tuning the concentration of the CCTEL components, the shape of QDs, and/or the disparity of chemical functionality between ligands of the different QDs, the arrangement of each QD population with respect to the other within the CCTEL may be controlled. Depending on the final arrangement of the QDs in the active layer, different advantages with respect to singly doped CCTELs may be readily obtained.

In one exemplary embodiment, the emissive layer of green (G) and red (R) sub-pixels may contain a mixture of blue-emitting (B) QDs with narrower-gap G-emitting or R-emitting QDs (e.g., G-emitting or R-emitting QDs with a narrower energy band gap between a conduction band and a valence band than that associated with B-emitting QDs). In such a co-doped CCTEL, excitons can form and recombine on G or R QDs via charge and energy funneling through the wider-gap matrix and B QDs. Excitons that form on B QDs could be transferred to G or R QDs via resonant energy transfer (RET), which occurs even if energetic barriers for charges are present, either between the G/R QDs and the transporting materials, or between the G/R QDs and the B QDs. This configuration may extend the range of charge transport materials that can be integrated in the device, given that the energy level alignment between the transport material and the G/R QDs does not need to be optimal if excitons can be formed on the B QDs, to be ultimately transferred to the G/R QDs.

In some embodiments, QDs may migrate toward an outer surface of the doubly doped CCTELs, with the B QDs preferentially distributed between the R/G QDs and the electron transport layer (ETL). This distribution may be obtained by functionalizing the B QDs with ligands that have poorer affinity with the transport matrix compared to those ligands attached to the R/G QDs. With such an arrangement, the B QD layer may act as an electron blocking layer (EBL), which may help improve charge balance within the CCTEL. Another advantage may be that the CCTEL and EBL are deposited from the same solution, in which the two QD populations are mixed with the cross-linkable matrix precursor.

Alternatively, by tuning the disparity of the ligands and the relative concentration of the two QD populations in the CCTEL, upon phase segregation towards one surface, the QDs may form a uniformly mixed layer containing both B QDs and R/G QDs. In such an intermixed layer, B QDs may act both as exciton/charge blocking materials that funnel energy towards the R/G QDs, and as spacers between R/G QDs that suppress the energy transfer between R/G QDs (e.g., energy transfer to non-emissive or defective R/G QDs). The latter process may be responsible for the decreased radiative efficiency of QD films compared to dilute solutions, since in closely packed QD solids, the probability of RET to non-emissive or defective QDs is higher. Therefore, by mixing a population of R or G QDs with wider-gap (e.g., B) QDs, the average distance between the R/G QDs may be increased sufficiently enough to prevent R/G inter-dot RET, such as those RET pathways terminating at a defective QD.

Figure 1A:
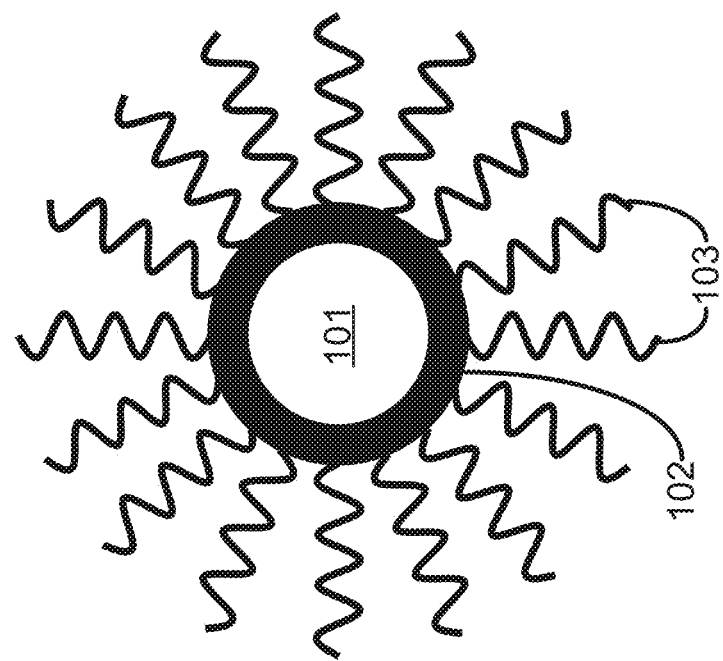

FIGS. 1A and 1B are two-dimensional schematic illustrations of a conventional core-shell QD 100A and QD 100B, respectively, which may be employed as an emissive material in a QLED. QD 100A may include a semiconductor nanocrystalline core 101 having a co-crystallized shell 102 of a different semiconducting material, which in turn may be covered by ligands 103. Ligands 103 may enable the dispersion of QD 100A in conventional solvents and passivate crystal defects present on the surface of QD 100A. QD 100B of FIG. 1B is a simplified version of QD 100A of FIG. 1A, illustrating a generic core-shell QD 104 and a surrounding region of ligands 103.

The cross-sections in FIG. 1 depict QDs 100A and 100B as spherical. However, in some embodiments, QDs 100A and 100B may exhibit an elongated shape (e.g., rod-like, platelet-like, or discoidal) or shapes of higher complexity (e.g., a quasi-spherical core with a multi-branched shell). Furthermore, the shell materials may not cover the core evenly, and the thickness of the shell may not be uniform, with a corresponding shell volume lower than, equal to, or higher than the core volume.

While the present disclosure primarily describes QDs as core-shell quantum dots, in some embodiments, the QDs may not present a core-shell structure. In other embodiments, the QDs may be of a core/multiple-shell type having more than one shell.

In some embodiments, exemplary quantum dot core 101 and shell 102 materials may include, but are not limited to, one or more of InP, carbon, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, and $ZnSe_xTe_{1-x}$, $Zn_wCu_zIn_{1-(w+z)}S$, where $0 \le w, x, y, z \le 1$. In some embodiments, w, x, y, and z may vary within core 101 and/or shell 102 volume. Core 101 and/or shell 102 materials may also include a perovskite-like or double-perovskite structure with $ABX_3$, $A_2BB'X_6$, $ABX_4$, and $A_3B_2X_9$ stoichiometry.

Exemplary ligands 103 may include, but are not limited to, alkyl, -alkenyl, -alkynyl, or aryl (linear, branched, or cyclic) thiols with 1 to 30 atoms of carbon; alkyl, -alkenyl, -alkynyl or aryl (linear, branched, or cyclic) alcohols with 1 to 30 atoms of carbon; alkyl, -alkenyl, -alkynyl or aryl (linear, branched, or cyclic) carboxylic acids with 1 to 30 atoms of carbon; tri-alkyl, -alkenyl, -alkynyl, or aryl (linear, branched, or cyclic) phosphine oxides with 1 to 60 atoms of carbon; alkyl, -alkenyl, -alkynyl, or aryl (linear, branched, or cyclic) amines with 1 to 30 atoms of carbon; salts formed from any of the above listed compounds (e.g., where the anion or the cation are the binding moieties); and halogen salts (e.g., where the anion or the cation are the binding moieties) from any of the above listed compounds.

Figure 2:
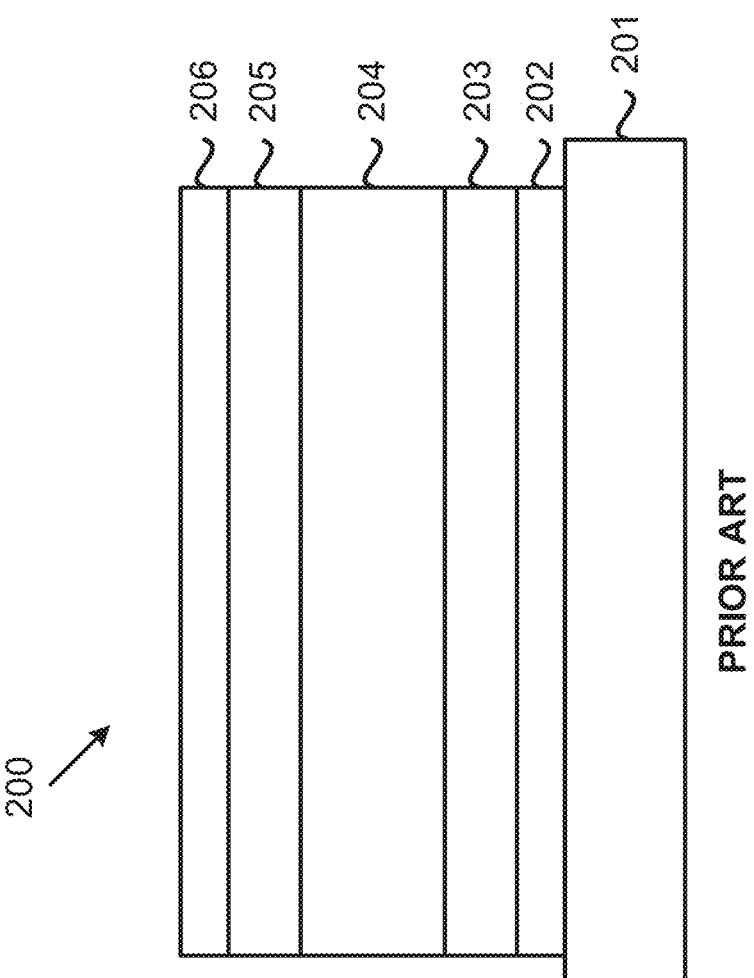
FIG. 2 is a schematic cross-sectional side view of a conventional quantum dot LED.

In FIG. 2, a schematic cross-sectional side view of a conventional QLED 200 structure is illustrated. QLED 200 may include multiple planar layers disposed on a substrate 201. These layers may include a first electrode 202, a second electrode 206, an emissive layer (EML) 204 disposed between first electrode 202 and second electrode 206, one or more charge transport layers (CTLs) 203 between first electrode 202 and EML 204, and one or more second CTLs 205 between second electrode 206 and EML 204. In some examples, QLED 200 may have what is commonly referred to as a "conventional structure," "standard structure," or "direct structure," in which first electrode 202 is an anode, second electrode 206 is a cathode, one or more first CTLs 203 are hole transport layers (HTLs), and one or more second CTLs 205 are electron transport layers (ETLs). In other examples, QLED 200 may have what is commonly known as an "inverted structure," in which first electrode 202 is a cathode, second electrode 206 is an anode, one or more first CTLs 203 are ETLs, and one or more second CTLs 205 are HTLs. Further, QLED 200 may be described as "bottom-emitting" if light is primarily emitted out of the substrate 201 side of QLED 200, and QLED 200 may be described as "top-emitting" if light is primarily emitted out of the second electrode 206 side opposite from the substrate 201.

Figure 3:
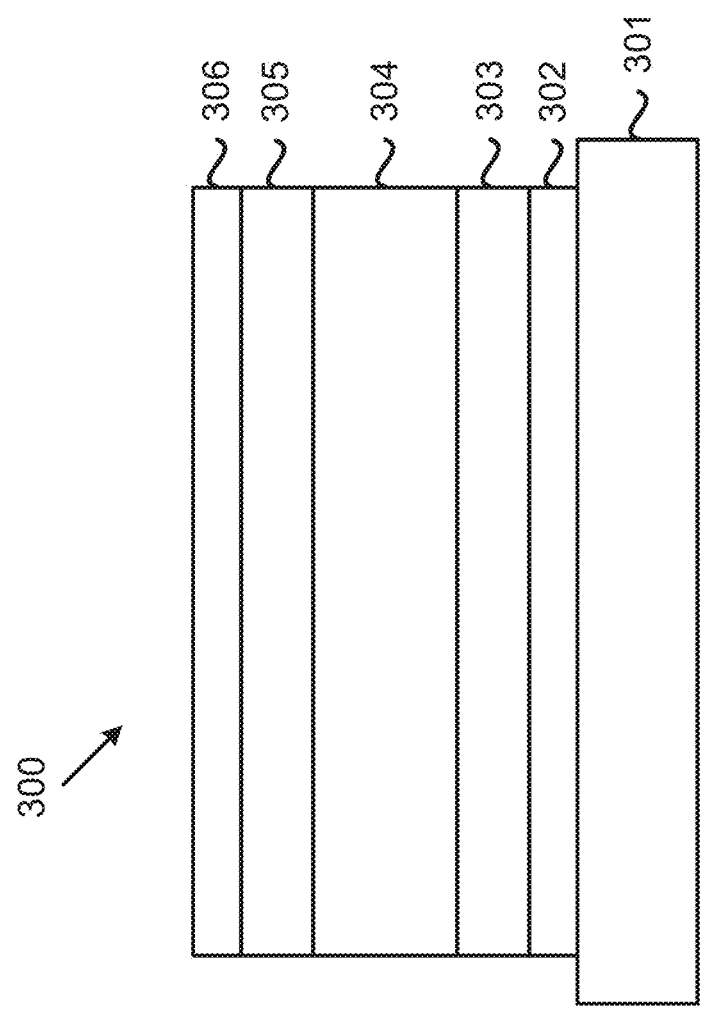
FIG. 3 is a schematic cross-sectional side view of a quantum dot LED, in accordance with example implementations of the present disclosure.

FIG. 3 is a schematic cross-sectional view of a QLED 300 structure in accordance with the present disclosure. In analogy to the foregoing "conventional" QLED 200, exemplary QLED 300 may include multiple planar layers deposited on a substrate 301. The layers may include a first electrode 302, an optional one or more first CTLs 303, an optional one or more second CTLs 305, and a second electrode 306.

In some embodiments, substrate 301 may include one or more materials typically used in light-emitting devices, such as glass and polymers, including, but not limited to, polyimides, polyethenes, polyethylenes, polyesters, polycarbonates, polyethersulfones, polypropylenes, and/or polyether ether ketones.

First electrode 302 and second electrode 306, in some examples, may include one or more materials typically used in light-emitting devices. At least one of first electrode 302 and second electrode 306 may be a transparent or semi-transparent electrode for light emission, and the other of first electrode 302 and second electrode 306 may be a reflective electrode to reflect any internal light toward the light-emitting side of QLED 300. In the case of a bottom-emitting device, first electrode 302 may be transparent or semi-transparent, while second electrode 306 may be a reflective electrode (e.g., a reflective metal, such as silver). In the case of a top-emitting device, first electrode 302 may be a reflective electrode, while second electrode 306 may be a transparent or semi-transparent electrode. Typical materials for the transparent or semi-transparent electrode may include indium-doped tin oxide (ITO), fluorine-doped tin oxide (FTO), indium-doped zinc oxide (IZO), aluminum-doped zinc-oxide (AZO), indium-doped cadmium-oxide, and the like. Typical materials used for the reflective electrode may include metals such as aluminum or silver (e.g., cathodes for a conventional structure) and gold or platinum (e.g., anodes for an inverted structure). Top-emitting structures may use a semi-transparent second electrode 306 such as thin (<20 nm) silver, a metallic bilayer (e.g., 2 nm Aluminum/15 nm Silver) or a magnesium-silver alloy. First electrode 302 and second electrode 306 may also be provided in any suitable arrangement. As an example, first electrode 302 and second electrode 306 may address a thin-film transistor (TFT) circuit.

In contrast to the conventional structure of QLED 200, QLED 300 may not include an EML 204, but instead may possess a combined charge transport and emissive layer (CCTEL) 304. CCTEL 304 may include a mixture of QDs and a charge transport matrix, thus combining properties of a CTL and an EML. Unlike conventional CCTEL configurations, in the embodiments of the present disclosure, CCTEL 304 may include two different populations of QDs, which may differ by one or more of composition, energy gap (and hence emission color), frontier energy level, shape, size, and/or surface ligands. Further details about the structure and composition of exemplary embodiments of CCTEL 304 in accordance with the present disclosure are provided below.

Figure 4A:
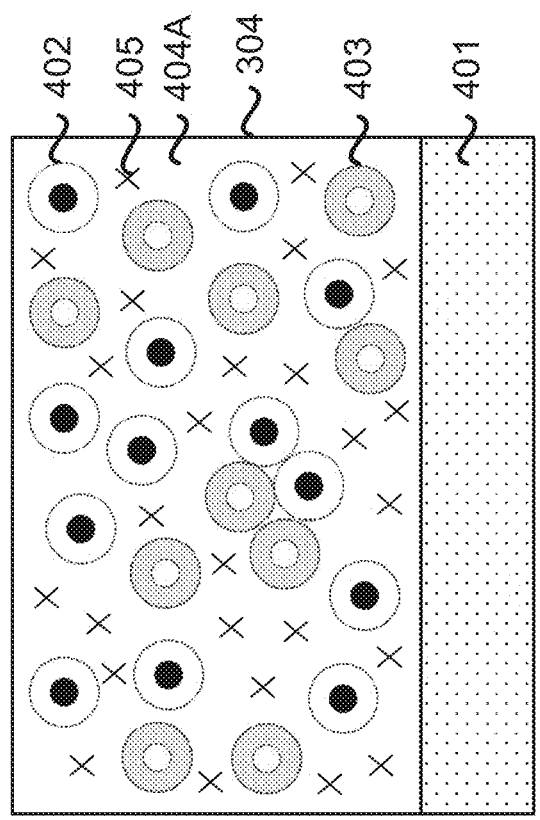
FIGS. 4A and 4B are schematic cross-sectional side views of combined charge transport and emissive layers of quantum dot LEDs based on a photo-cross-linkable matrix, together with an adjacent layer, in accordance with example implementations of the present disclosure.
Figure 4B:
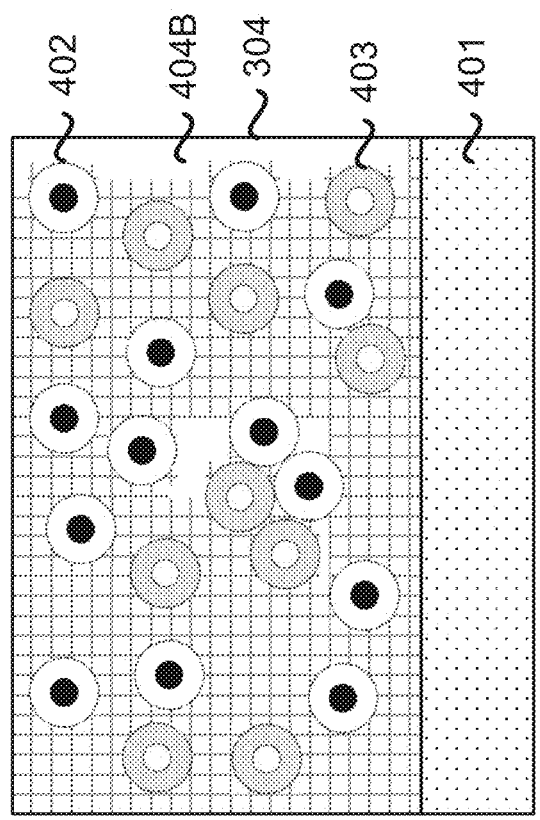

FIGS. 4A and 4B are schematic cross-sectional views of a photo-cross-linkable mixture 404A and a resulting photo-crosslinked charge transport matrix 404B, respectively, of CCTEL 304 deposited on a generic underlayer 401. In some embodiments, underlayer 401 may be a charge transport layer or an electrode. CCTEL 304 may contain two different populations of quantum dots: a population of narrower-gap QDs 402 and a population of wider-gap QDs 403. As employed herein, the terms "narrower-gap" and "wider-gap" refer to the energy gap of the QDs. More specifically, narrower-gap QDs 402 have a narrower energy gap, and thus closer frontier energy levels, than wider-gap QDs 403. QDs 402 and 403 may be randomly dispersed in a photo-cross-linkable charge transport matrix mixture 404A (as shown in FIG. 4A) and subsequent crosslinked charge transport matrix 404B (as depicted in FIG. 4B), such as after photo-polymerization (e.g., by exposure to ultraviolet (UV) light). The average distance between QDs 402 and 403 may not be uniform, and clusters of QDs 402 and 403 from both populations might form in CCTEL 304.

In some embodiments, an advantage offered by the presence of an additional wider-gap QD 403 population derives from a desire to address the typically lower hole current density in QLEDs compared to the electron current density. Such an unbalanced charge flow may lead to an exciton recombination zone peaking at, or in proximity to, the interface between CCTEL 304 and first electrode 302 (e.g., an anode), or between CCTEL 304 and optional CTL 303 (e.g., an HTL). This occurrence may be detrimental for both the efficiency and stability of a QLED. In an embodiment of the present disclosure, wider-gap QDs 403, with their lower electron affinity, may limit the flow of electrons inside CCTEL 304 toward narrow-gap QDs 402 by effectively increasing the energetic injection barrier for electrons. This barrier increase may move the recombination region towards a center of CCTEL 304 and ultimately improve charge balance.

In some embodiments, wider-gap QDs 403 may be blue-emitting (B) QDs, and narrower-gap QDs 402 may be green-emitting (G) or red-emitting (R) QDs. In other embodiments, wider-gap QDs 403 may be G QDs, and narrow-gap ODs 402 may be R QDs. In yet other embodiments, both populations of QDs 402 and 403 might emit in the same B, G, or R spectral range, with one population having a wider energy gap compared to the other population.

Mixture 404A may be deposited via commonly used solution process techniques, including, but not limited to, drop casting, spin coating, slot die coating, doctor blading, spray coating, dip coating, bar coating, and inkjet printing.

To enable patterning, and hence the deposition of different CCTELs on different areas of underlayer 401, mixture 404A may be a photo-cross-linkable material. The average distance between QDs 402 and 403, and QD distribution in the photo-crosslinked matrix 404B, may be the same as those in mixture 404A before photo-polymerization as depicted in FIGS. 4A and 4B. In other embodiments, the initial average distance between QDs 402 and 403 and QD distribution may vary following the photo-polymerization process.

Exemplary photo-cross-linkable materials may include N4,N4'-Bis(4-(6-((3-ethyloxetan-3-yl)methoxy)hexyl)phenyl)-N4,N4'-diphenylbiphenyl-4,4'-diamine (OTPD); N4,N4'-Bis(4-(6-((3-ethyloxetan-3-yl)methoxy)hexyloxy) phenyl)-N4,N4'-bis(4-methoxyphenyl)biphenyl-4,4'-diamine (QUPD); N,N'-(4,4'-(Cyclohexane-1,1-diyl)bis(4, 1-phenylene))bis(N-(4-(6-(2-ethyloxetan-2-yloxy)hexyl) phenyl)-3,4,5-trifluoroaniline) (X-F6-TAPC); N4,N4'-Di (naphthalen-1-yl)-N4,N4'-bis(4-vinylphenyl)biphenyl-4,4'-diamine (VNPB); 9,9-Bis[4-[(4-ethenylphenyl)methoxy] phenyl]-N2,N7-di-1-naphthalenyl-N2,N7-diphenyl-9H-Fluorene-2,7-diamine (VB-FNPD); 3,5-di-9H-carbazol-9-yl-N,N-bis[4-[[6-[(3-ethyl-3-oxetanyl)methoxy]hexyl]oxy] phenyl]-benzenamine (Oxe-DCDPA).

However, in some embodiments, photo-cross-linkable mixture 404A and resulting charge transport matrix 404B may include any class of organic semiconductors with photo-cross-linkable moieties, including oxetane, epoxy, bromo, vinyl, acrylate, and azide functional groups.

In some embodiments, the photo-cross-linking or photo-polymerization may occur if one or more initiators 405 are present in CCTEL mixture 404A. In some embodiments, the initiator is a photo-initiator, and its relative content inside the CCTEL mixture may vary from 0.1 to 20 wt % (percentage by weight). Exemplary photo-initiators may include sulfonium- and iodonium-salts (e.g., triphenylsulfonium triflate, diphenyliodonium triflate, iodonium, [4-(octyloxy)phenyl] phenyl hexafluorophosphate, bis(4-methylphenyl)iodonium hexafluorophosphate, diphenyliodonium hexafluoroarsenate, diphenyliodonium hexafluoroantimonate, etc.), chromophores containing the benzoyl group (e.g., benzoin ether derivatives, halogenated ketones, dialkoxyacetophenones, diphenylacetophenones, etc.), hydroxy alkyl heterocyclic or conjugated ketones, benzophenone- and thioxanthone-moiety-based cleavable systems (e.g., benzophenone phenyl sulfides, ketosulfoxides, etc.), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, Barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

The total content of QDs 402 and 403 inside cross-linkable mixture 404A may vary from 10 to 75 wt %. The relative concentration of the QD population with narrower-gap QDs 402 may be higher, equal, or lower compared to the relative concentration of QD population with wider-gap QDs 403 and may be adjusted to tune the electroluminescence spectral profile of doubly doped CCTEL 304.

In doubly doped CCTEL 304, electroluminescence may occur preferentially from narrower-gap QDs 402, which may possess a deeper conduction band. This phenomenon may occur because, in the electroluminescence process, injected holes and electrons naturally move to lower energy sites before exciton formation and deactivation. Optionally, excitons that may form on wider-gap QDs 403 may be partly transferred via resonant energy transfer (RET) to narrower-gap QDs 402. It should be noted that RET occurs even if energetic barriers for charges were present, either between narrower-gap QDs 402 and the transporting materials or, between the narrower-gap QDs 402 and wider-gap QDs 403. This may extend the range of charge transport materials that can be integrated in the device, given that the energy level alignment between the transport materials and narrower-gap QDs 402 may not need to be optimal if excitons can be formed at least on wider-gap QDs 403, to be ultimately transferred to narrower-gap QDs 402.

FIGS. 5A-5D are cross-sectional side views of exemplary QLEDs 500A-500D, respectively (collectively, QLEDs 500), of multiple planar layers deposited on a substrate 501. The layers may include an anode 502, an optional one or more HTLs 503, an optional one or more ETLs 505, and a cathode 506. Also, QLEDs 500A and 500B may include a CCTEL 504A that includes a crosslinked hole transport matrix 509. QLEDs 500C and 500D may include a CCTEL 504B that includes a crosslinked electron transport matrix 510. Within CCTEL 504A and 504B, QDs 507 and 508 may be distributed unevenly. Namely, QDs 507 and 508 in CCTEL 504A and 504B may be phase-segregated from crosslinked hole transport matrix 509 or crosslinked electron transport matrix 510 as a result of the minimization of surface energy. Phase segregation of QDs 507 and 508 may occur during the deposition of the CCTEL solution, during the photo-polymerization process, or following the exposure of the sample to heat and/or other external stimuli (such as pressure and/or change of pH).

CCTEL 504A and 504B in FIGS. 5A-5D may contain two populations of different quantum dots, and the arrangement of each QD population with respect to the other population inside CCTEL 504A and 504B may be controlled in a number of ways. For example, the arrangement of the QD populations may be controlled by tuning one or more of the disparity of chemical functionality between the QD ligands and between the ligands and the matrix, the relative concentration of each QD component, the size of the QD, and/or the shape of the QDs.

Figure 5B:
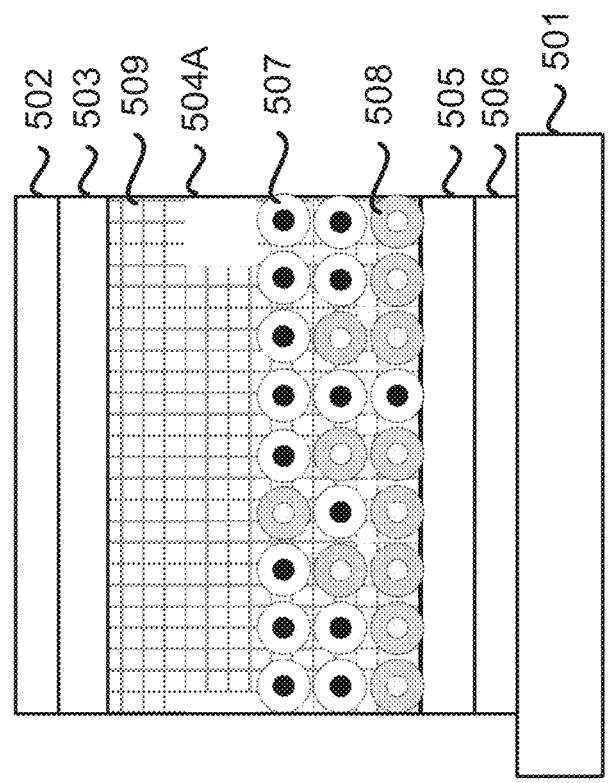
FIGS. 5A-5D are schematic cross-sectional side views of quantum dot LEDs with a crosslinked combined charge transport and emissive layer, in accordance with example implementations of the present disclosure.
Figure 5A:
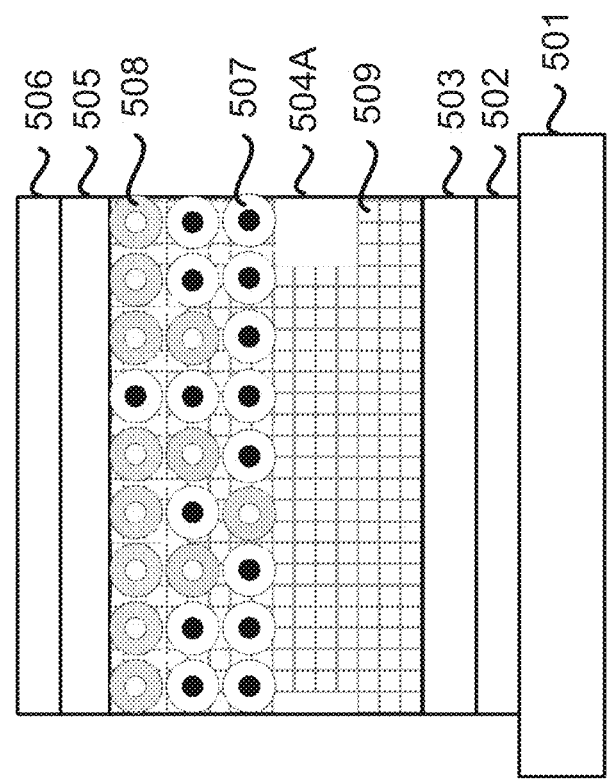

Referring to FIGS. 5A and 5B, crosslinked hole transport matrix 509 of CCTEL 504A may include two populations of different quantum dots: narrower-gap QDs 507 and wider-gap QDs 508.

More specifically, FIG. 5A illustrates a standard structure QLED 500A, with narrower-gap QDs 507 and wider-gap QDs 508 forming a layer, which in some embodiments may include a double QD layer or multiple QD monolayers, atop crosslinked hole transport matrix 509. Wider-gap QDs 508 may distribute primarily at the upper outer surface of CCTEL 504A (e.g., the surface in contact with ETL 505). Narrower-gap QDs 507 may preferentially segregate in the same half portion of CCTEL 504A, primarily below wider-gap QDs 508 (e.g., closer to anode 502).

FIG. 5B shows an inverted structure QLED 500B, with narrower-gap QDs 507 and wider-gap QDs 508 forming a layer, which in some examples may include a double QD layer or multiple QD monolayers, below crosslinked hole transport matrix 509. Wider-gap QDs 508 may distribute primarily at the lower outer surface of CCTEL 504A (e.g., the surface in contact with ETL 505). Narrower-gap QDs 507 may preferentially segregate in the same half portion of CCTEL 504A, primarily above wider-gap QDs 508 (e.g., closer to anode 502).

Figure 5C:
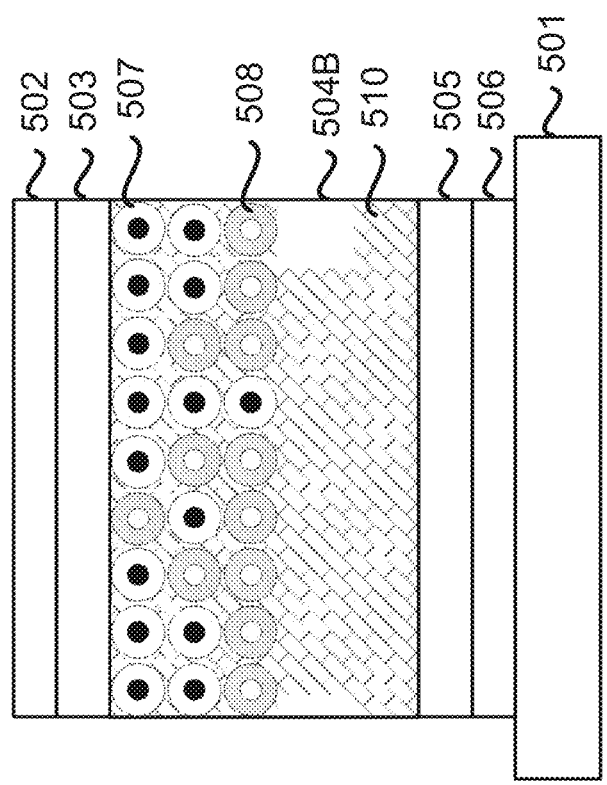
Figure 5D:
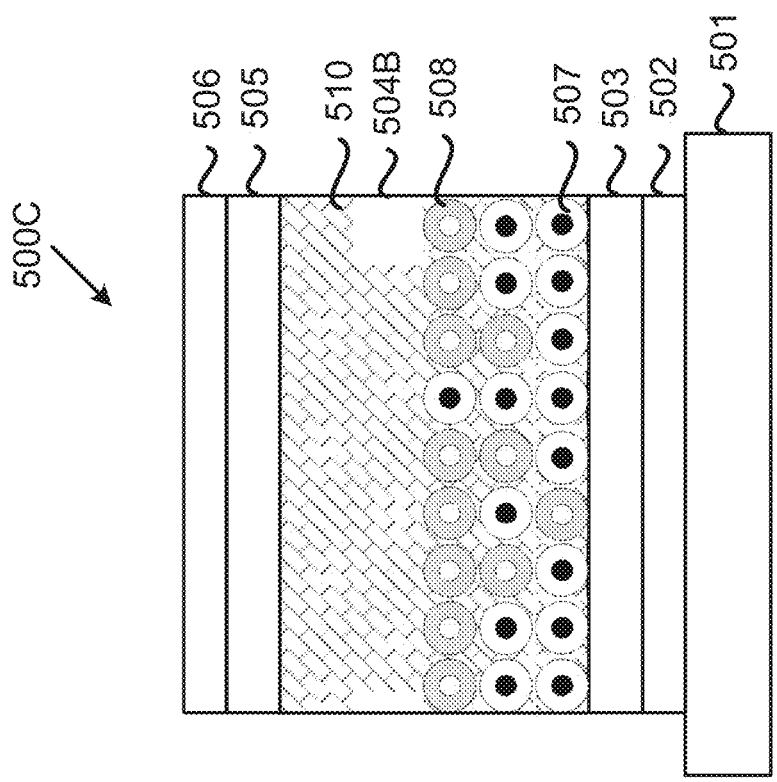

Referring to FIGS. 5C and 5D, crosslinked electron transport matrix 510 of CCTEL 504B may include two populations of different quantum dots: narrower-gap QDs 507 and wider-gap QDs 508.

More specifically, FIG. 5C depicts a standard structure QLED 504C, with narrower-gap QDs 507 and wider-gap QDs 508 forming a layer, which in some embodiments may include a double QD layer or multiple QD monolayers, below crosslinked electron transport matrix 510. Narrower-gap QDs 507 may distribute primarily at the lower outer surface of CCTEL 504B (e.g., the surface in contact with HTL 503). Wider-gap QDs 508 may preferentially segregate in the same half portion of CCTEL 504B, primarily above narrower-gap QDs 507 (i.e., closer to cathode 506).

FIG. 5D shows an inverted structure QLED 500D, with narrower-gap QDs 507 and wider-gap QDs 508 forming a layer, which in some examples may include a double QD layer or multiple QD monolayers, atop crosslinked electron transport matrix 510. Narrower-gap QDs 507 may distribute primarily at the upper outer surface of CCTEL 504B (e.g., the surface in contact with HTL 503). Wider-gap QDs 508 may preferentially segregate in the same half portion of CCTEL 504B, primarily below narrower-gap QDs 507 (e.g., closer to cathode 506).

In some embodiments, the final packing geometry may be different than that schematically shown in FIGS. 5A-5D. For example, in some embodiments, QDs 507 and 508 may segregate to form hexagonally close-packed layers, with crosslinked hole transport matrix 509 and crosslinked electron transport matrix 510 filling the voids between QDs 507 and 508. In other embodiments, QD 507 and 508 packing density may be lower, with matrix-rich voids occupying significantly more of the volume (e.g., more than 26% of the volume) in the region of CCTEL 504A and 504B where QDs 507 and 508 segregate.

In the embodiments illustrated in FIGS. 5A-5D, the concentration profile of wider-gap QDs 508 inside CCTEL 504A and 504B has its maximum at, or in closer proximity to, the interface closer to cathode 506 compared to narrower-gap QDs 507. Such an arrangement may be beneficial for improving the charge balance inside CCTEL 504A and 504B, with wider-gap QDs 508 acting as a blocking material for electrons, whose mobility in most QLEDs is typically higher than that of holes.

The electron-blocking nature of wider-gap QDs 508 may be further visualized in energy band diagrams 600A-600D in FIGS. 6A-6D, respectively. More specifically, each energy band diagram 600A-600D corresponds to one of QLEDs 500A-500D, respectively. Each energy band diagram 600A-600D graphically indicates an anode Fermi energy level 602 for anode 502 and a cathode Fermi energy level 606 for cathode 506. Also indicated in energy band diagrams 600A-600D are HTL frontier energy levels 603 defining an energy gap (or band gap) for optional HTL 503, and ETL frontier energy levels 605 defining an energy gap for optional ETL 505. Additionally, energy band diagrams 600A and 600B indicate energy bands 604A associated with CCTEL 504A including crosslinked hole transport matrix 509, while energy band diagrams 600C and 600D indicate energy bands 604B associated with CCTEL 504B including crosslinked electron transport matrix 510.

Figure 6B:
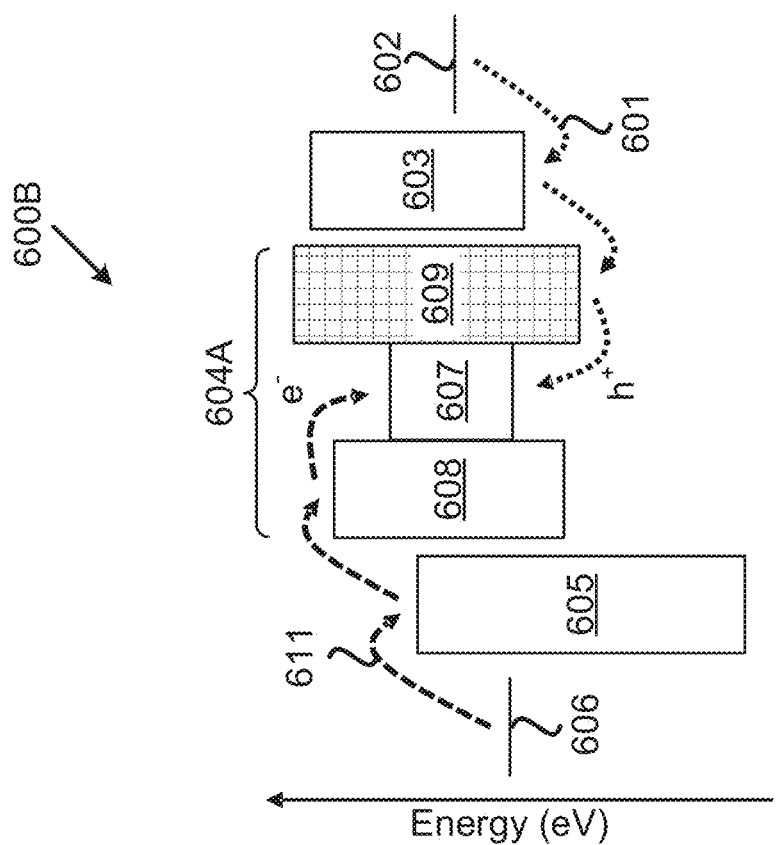
FIGS. 6A-6D are energy band diagrams of the quantum dot LEDs of FIGS. 5A-5D, respectively, in accordance with example implementations of the present disclosure.
Figure 6A:
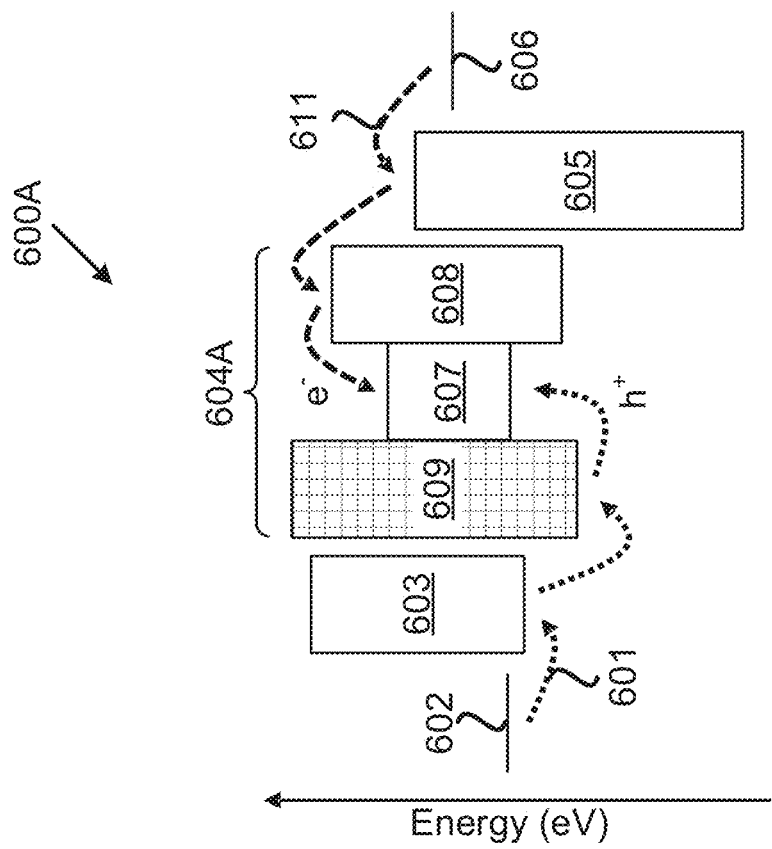
Figure 6D:
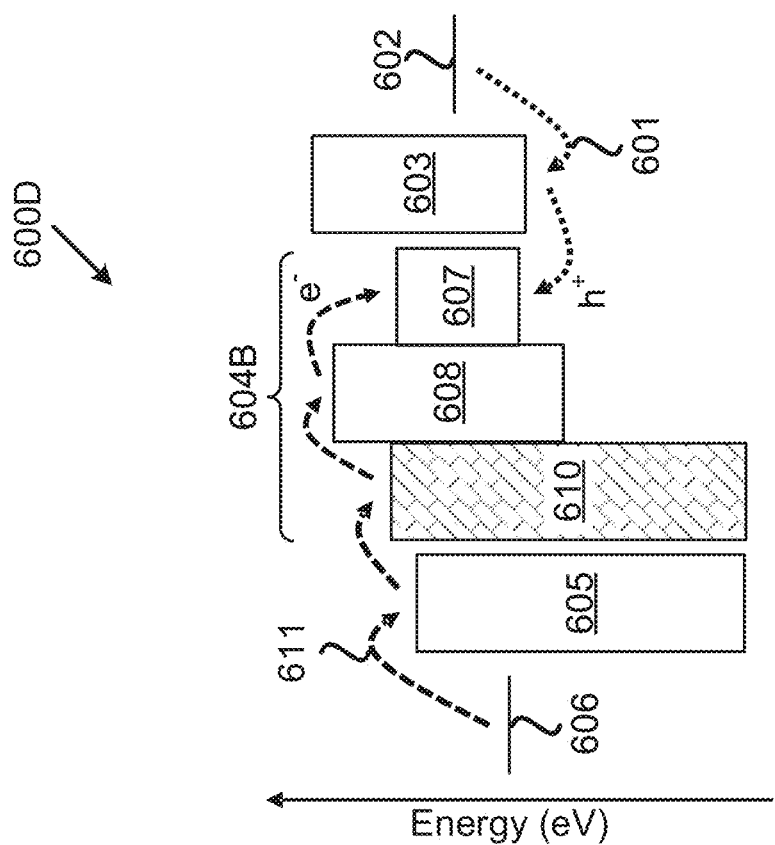
Figure 6C:
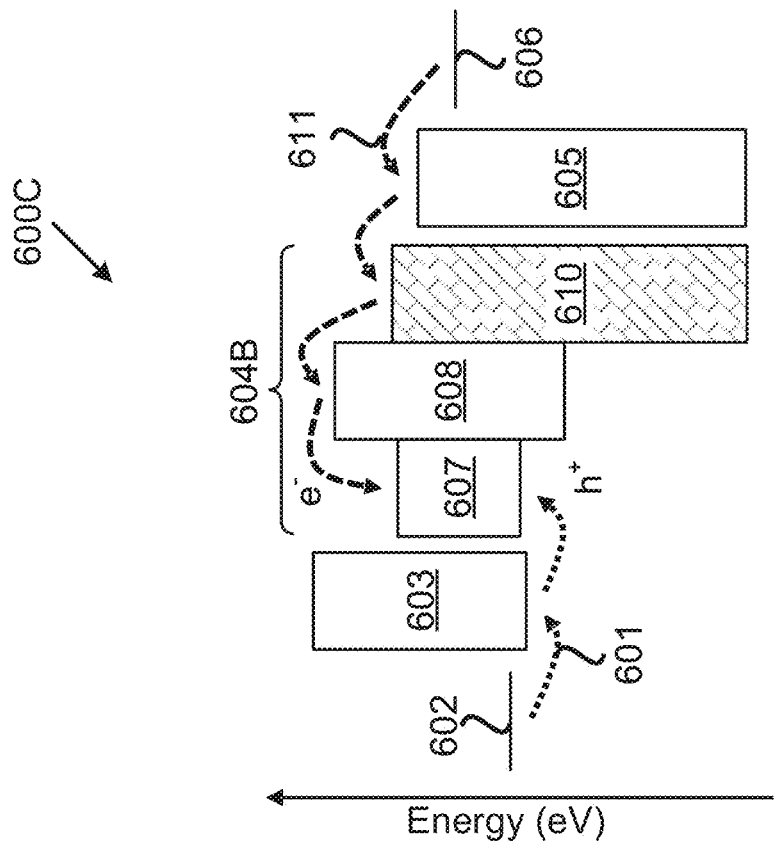

More specifically, in FIGS. 6A and 6B, energy bands 604A include narrower-gap QD frontier energy levels 607 for narrower-gap QDs 507, wider-gap QD frontier energy levels 608 for wider-gap QDs 508, and crosslinked hole transport matrix frontier energy levels 609 for crosslinked hole transport matrix 509. As to FIGS. 6C and 67D, energy bands 604B include narrower-gap QD frontier energy levels 607 for narrower-gap QDs 507, wider-gap QD frontier energy levels 608 for wider-gap QDs 508, and crosslinked electron transport matrix frontier energy levels 610 for crosslinked electron transport matrix 510. Consequently, in FIGS. 6A-6D, narrower-gap QDs 507 are shown to have a narrower energy gap, as defined by narrower-gap QD frontier energy levels 607, than wider-gap QDs 508, as indicated by wider-gap QD frontier energy levels 608.

FIGS. 6A-6D further denote paths through which a hole current 601 and an electron current 611 follow so that holes and electrons are combined within CCTEL 504A and 504B to energize narrower-gap QDs 507 to cause light emission. As depicted therein, hole current 601 from anode 502 and electron current 611 from cathode 506 are controlled by the hole and electron mobility of each component of QLEDs 500A-500D, and by the energetic barriers at interfaces between the different layers. In some embodiments, the physical segregation of wider-gap QDs 508 within CCTEL 504A and 504B, as described above, as well as the shallower conduction band of wider-gap QD frontier energy levels 608 relative to narrower-gap QD frontier energy levels 607 and ETL frontier energy levels 605 (and, in the case of FIGS. 6C and 6D, crosslinked electron transport matrix frontier energy levels 610) may create an energetic barrier for electron injection via electron current 611 into narrower-gap QDs 507. In some such embodiments, this barrier may help reduce the injection of the majority carriers (e.g., electrons (e), as shown in FIGS. 6A-6D, and as typically observed in QLEDs) into the emissive narrower-gap QDs 507, ultimately leading to a more balanced charge injection and higher QLED efficiency.

In other embodiments, the relative arrangement of narrower-gap QD frontier energy levels 607 and wider-gap QD frontier energy levels 608 may differ from those embodiments represented in FIGS. 6A-6D. For instance, wider-gap QD frontier energy levels 608 may define a valence band maximum energy level higher than or equal to the valence band maximum energy level of emissive narrow-gap QD frontier energy levels 607, unlike the scenarios of FIGS. 6A-6D. In another embodiment, wider-gap QD frontier energy levels 608 may define a conduction band minimum energy level lower than or equal to the conduction band minimum energy level of emissive narrow-gap QD frontier energy levels 607, also unlike the embodiments of FIGS. 6A-6D. Further, ETL frontier energy levels 605 (and, in the case of FIGS. 6C and 6D, crosslinked electron transport matrix frontier energy levels 610) may be altered to manage (e.g., equalize) the hole and electron injection into emissive narrower-gap QDs 507, with or without the existence of an energetic barrier to electron injection being provided by wider-gap QDs 508.

FIGS. 7A-7D are schematic cross-sectional side views of QLEDs 700A-700D, respectively, with alternative CCTELs 704A and 704B, in accordance with example implementations of the present disclosure. Similar to FIGS. 5A-5D, QLEDs 700A and 700C represent standard configurations, while QLEDs 700B and 700D employ inverted configurations. Each QLED 700A-700D may include a substrate 701, an anode 702, a cathode 706, an optional one or more HTLs 703, and an optional one or more ETLs 705. Further, QLEDs 700A and 700B may include a CCTEL 704A that includes a crosslinked hole transport matrix 709. QLEDs 700C and 700D may include a CCTEL 704B that includes a crosslinked electron transport matrix 710. Both CCTEL 704A and CCTEL 704B may also include a population of narrower-gap QDs 707 and a population of wider-gap QDs 708.

Figure 7A:
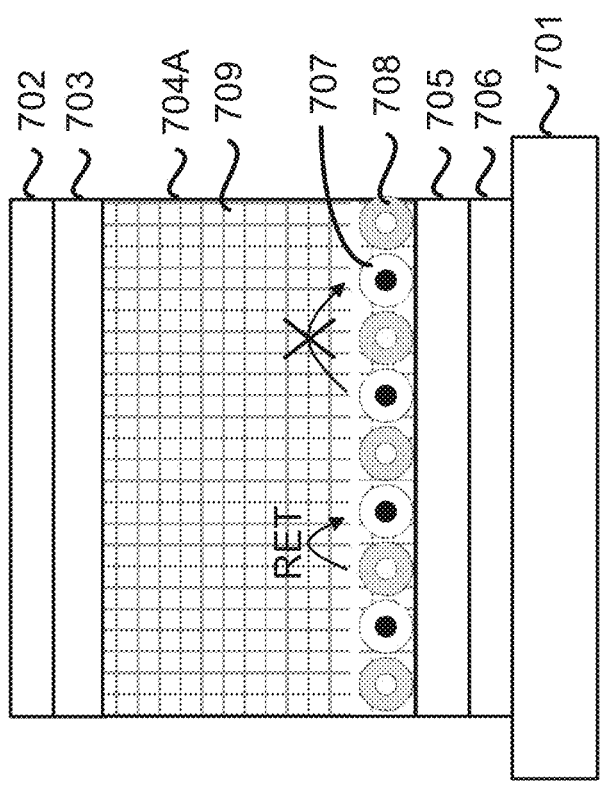
FIGS. 7A-7D are schematic cross-sectional side views of more quantum dot LEDs with a crosslinked combined charge transport and emissive layer, in accordance with example implementations of the present disclosure.
Figure 7B:
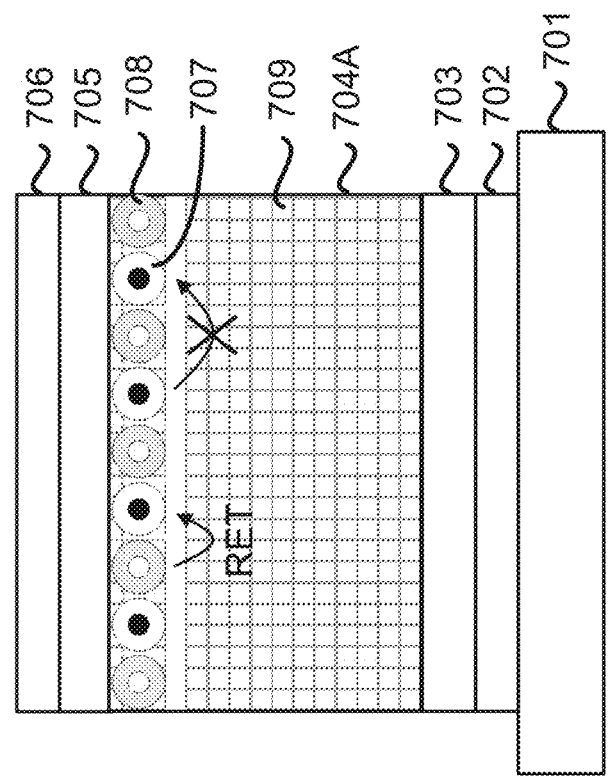
Figure 7D:
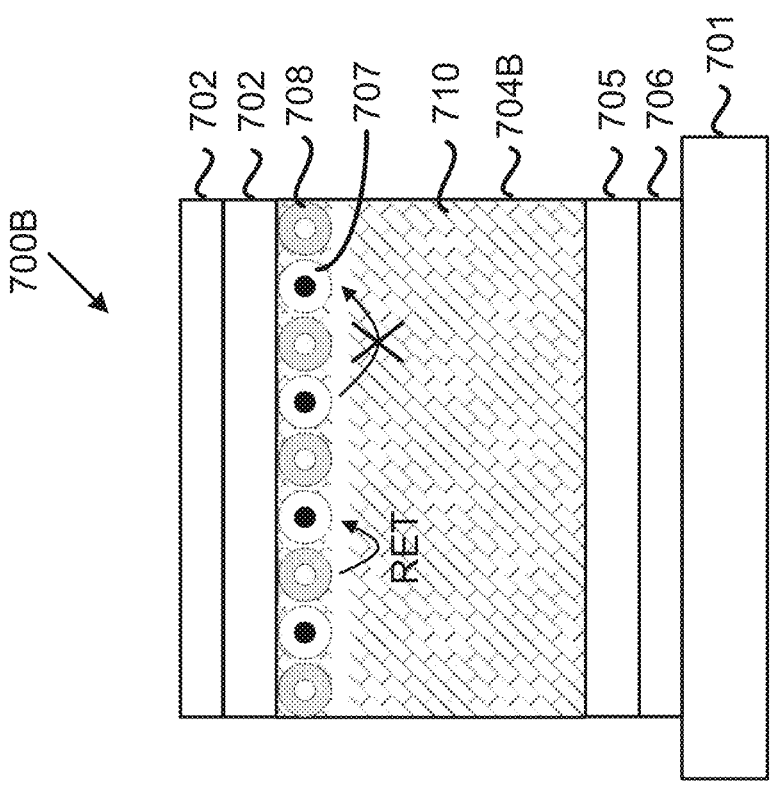
Figure 7C:
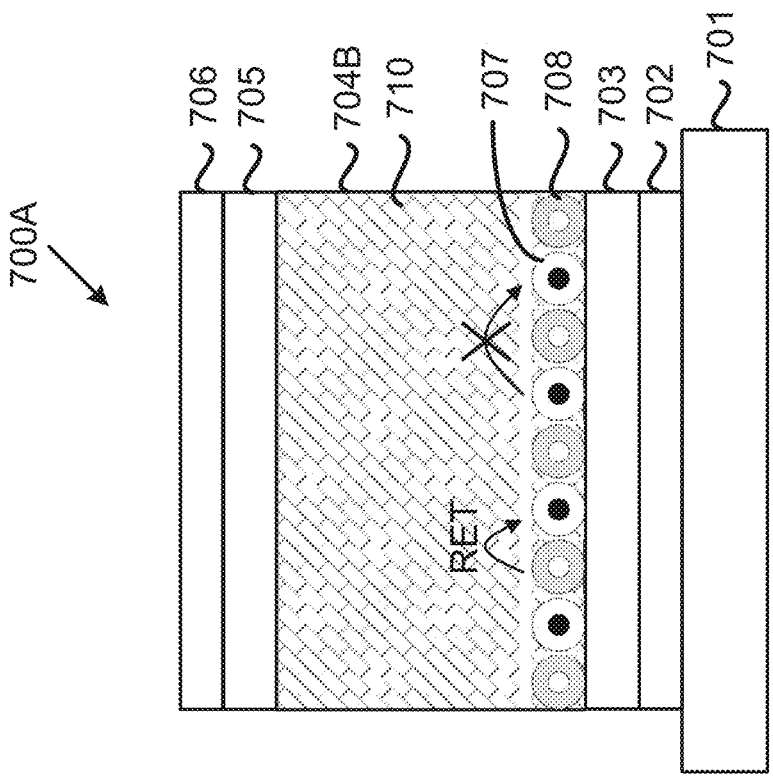

However, different from CCTEL 504A and CCTEL 504B of FIGS. 5A-5D, CCTEL 704A and CCTEL 704B may contain an overall lower concentration of QDs 707 and 708. For example, the concentration of QDs 707 and 708 may be low enough that QDs 707 and 708 may form a single monolayer at one of the outer surfaces of CCTEL 704A and 704B upon phase segregation. In a manner similar to that of FIGS. 5A-5D, the disparity of chemical functionality between QDs 707 and 708 and either hole transport matrix 709 (FIGS. 7A and 7B) or electron transport matrix 710 (FIGS. 7C and 7D) may be tuned to favor phase segregation. More specifically, phase segregation of QDs 707 and 708 may be favored toward the outer surface of CCTEL 704A closer to cathode 706 in the presence of a crosslinked hole transporting matrix (FIGS. 7A and 7B) and favored toward the outer surface of CCTEL 704B closer to anode 702 in the presence of a crosslinked electron transporting matrix (FIGS. 7C and 7D). However, differently from the previous embodiments of FIGS. 5A-5D, the chemical functionality of QDs 707 and QDs 708 may be of such similarity to favor the formation of a substantially evenly mixed monolayer containing both QD 707 and QD 708 populations.

An advantage offered by such an intermixed phase-segregated QD 707 and 708 layer, in some embodiments, is that wider-gap QDs 708 may act as spacers between narrow-gap QDs 707, thus possibly suppressing the probability of RET towards poorly emissive narrow-gap QDs 707. RET is primarily responsible for the decreased radiative efficiency associated with conventional QD films compared to QD dilute solutions, as the probability of RET to non-emissive or defective QDs is higher in solid-state QD layers. Instead, in some embodiments, excitons that may form on wider-gap QDs 708 of QLEDs 700A-700D may be partly or completely transferred via RET to more emissive narrow-gap QDs 707, while RET between narrow-gap QDs 707 may be reduced.

The above-detailed embodiments relate to a novel strategy to improve the efficiency of a single QLED incorporating a crosslinked CCTEL. In some embodiments, multiple QLEDs may be fabricated on a substrate to form a matrix of light-emitting devices. Furthermore, these QLED matrices may have pixel and sub-pixel arrangements, with each sub-pixel including a QLED that carries different QDs and/or QD mixtures that emit a different color of light (e.g., red (R), green (G), or blue (B) QDs).

For the fabrication of a multicolor high-resolution display based on a sub-pixel arrangement of CCTELs, the CCTEL of each sub-pixel composing a pixel may emit monochromatic red (R), green (G), or blue (B) light. Optionally, each sub-pixel may contain a CCTEL according to the embodiments discussed above (e.g., CCTELs that are doubly doped with two different populations of QDs). Optionally, in some embodiments, two sub-pixels may contain a doubly doped CCTEL. In yet other examples, only one sub-pixel may contain a doubly doped CCTEL.

Figure 8B:
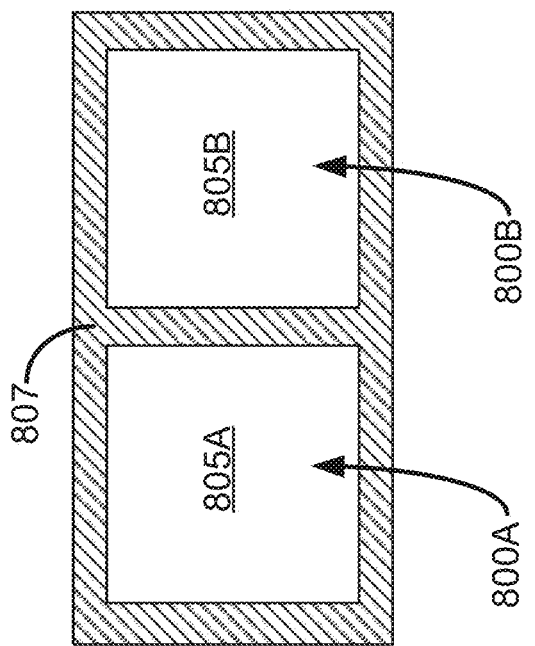
FIGS. 8A and 8B are schematic cross-sectional side and top views, respectively, of two patterned adjacent sub-pixels, in accordance with example implementations of the present disclosure.
Figure 8A:
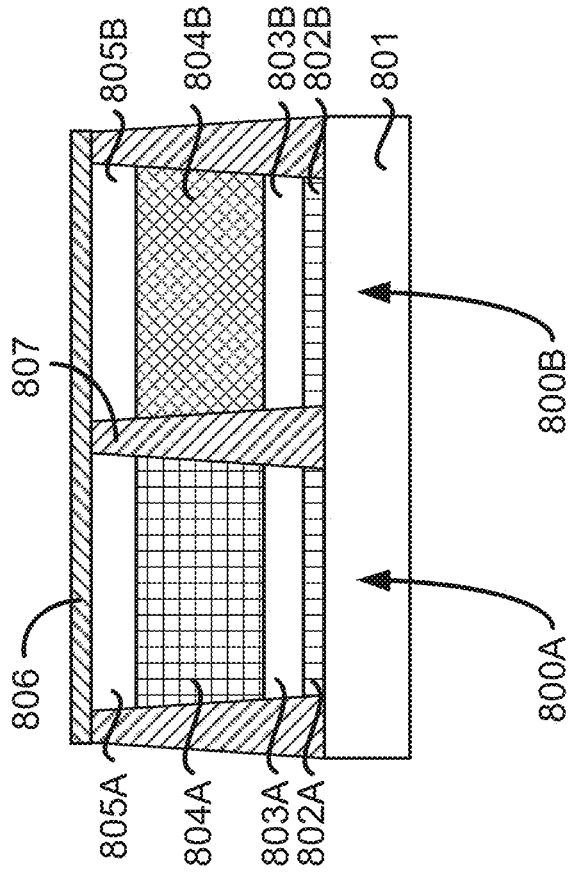

In exemplary embodiments, the patterned QLEDs constituting the matrix may be separated at least in part by one or more insulating materials to form a so-called "bank structure". FIGS. 8A and 8B are schematic cross-sectional side and top views, respectively, of an exemplary arrangement of a QLED matrix 800 that includes two QLEDs 800A and 800B in a bank structure 807 in some embodiments. In some other embodiments, any suitable number of QLEDs may deposited in this type of sub-pixel arrangement, with each sub-pixel containing a different QLED that emits light of a different color relative to QLEDs of other sub-pixels.

Referring to FIGS. 8A and 8B, QLEDs 800A and 800B may share a common substrate 801 and may be separated by the insulating material forming bank structure 807. Each QLED 800A and 800B may include a first electrode 802A and 802B, respectively, within a corresponding well that is defined by bank structure 807. A second or top electrode 806 common to both (or all) QLEDs 800A and 800B may be located atop bank substrate 807. Between first electrode 802 and second electrode 806, the structure of each QLED 800A and 800B may be configured to be similar to the embodiments depicted in FIG. 3, FIGS. 5A-5D, and FIGS. 7A-7D, with an optional first charge transport layer 803A and 803B and an optional second charge transport layer 805A and 805B, between which CCTELs 804A and 804B are located. CCTELs 804A and 804B may contain mixtures of quantum dots, in accordance with the above-described embodiments. First charge transport layers 803A and 803B and second charge transport layers 805A and 805B may be deposited commonly and may include the same materials and thickness. Alternatively, if based on cross-linkable materials, such layers may be deposited separately and present different compositions and thicknesses. In some embodiments, the overall thickness of each sub-pixel might be different and may be tuned to maximize the optical outcoupling efficiency of each color of light.

From the above discussion, it is evident that various techniques can be utilized for implementing the concepts of the present disclosure without departing from the scope of those concepts. Moreover, while the concepts have been described with specific reference to certain implementations, a person of ordinary skill in the art would recognize that changes can be made in form and detail without departing from the scope of those concepts. As such, the disclosure is to be considered in all respects as illustrative and not restrictive. It should also be understood that the present disclosure is not limited to the particular described implementations, but that many rearrangements, modifications, and substitutions are possible without departing from the scope of the present disclosure.

What is claimed is:

1. A light-emitting device, comprising:
   an anode;
   a cathode; and
   a combined charge transport and emissive layer (CCTEL) disposed between the anode and the cathode, the CCTEL comprising:
   a crosslinked charge transport material;
   a first plurality of quantum dots having a first energy gap; and
   a second plurality of quantum dots having a second energy gap wider than the first energy gap.

2. The light-emitting device of claim 1, wherein a difference between the first energy gap and the second energy gap results in a majority of light from the light-emitting device being emitted from the first plurality of quantum dots relative to the second plurality of quantum dots.

3. The light-emitting device of claim 1, wherein:
   the first plurality of quantum dots includes first surface ligands; and
   the second plurality of quantum dots include second surface ligands different from the first surface ligands.

4. The light-emitting device of claim 1, wherein:
   the first plurality of quantum dots has a first shape and a first size;
   the second plurality of quantum dots has a second shape and a second size; and at least one of the second shape is different than the first shape, or the second size is different than the first size.

5. The light-emitting device of claim 1, wherein the first plurality of quantum dots and the second plurality of quantum dots are phase-segregated from the crosslinked charge transport material toward a portion of the CCTEL closest to the cathode.

6. The light-emitting device of claim 5, wherein the second plurality of quantum dots is more highly concentrated in a sub-portion of the portion of the CCTEL closer to the cathode than the first plurality of quantum dots.

7. The light-emitting device of claim 1, wherein the first plurality of quantum dots and the second plurality of quantum dots are phase-segregated from the crosslinked charge transport material toward a portion of the CCTEL closest to the anode.

8. The light-emitting device of claim 7, wherein the first plurality of quantum dots is more highly concentrated in a sub-portion of the portion of the CCTEL closer to the anode than the second plurality of quantum dots.

9. The light-emitting device of claim 1, wherein the first plurality of quantum dots and the second plurality of quantum dots are evenly distributed in a monolayer at an outer surface of the CCTEL closest to the cathode.

10. The light-emitting device of claim 1, wherein the first plurality of quantum dots and the second plurality of quantum dots are evenly distributed in a monolayer at an outer surface of the CCTEL closest to the anode.

11. The light-emitting device of claim 1, wherein the crosslinked charge transport material comprises a hole transport material.

12. The light-emitting device of claim 1, wherein the crosslinked charge transport material comprises an electron transport material.

13. The light-emitting device of claim 1, further comprising a hole transport layer disposed between the anode and the CCTEL.

14. The light-emitting device of claim 1, further comprising an electron transport layer disposed between the cathode and the CCTEL.

15. The light-emitting device of claim 1, wherein:
the crosslinked charge transport material comprises a photo-cross-linkable material; and
the photo-cross-linkable material becomes crosslinked when subjected to an activation stimulus comprising exposure to ultraviolet (UV) light.

16. A light-emitting device array comprising:
a plurality of light-emitting devices, at least one of the plurality of light-emitting devices comprising:
an anode;
a cathode; and
a combined charge transport and emissive layer (CCTEL) disposed between the anode and the cathode, wherein the CCTEL comprises:
a crosslinked charge transport material;
a first plurality of quantum dots having a first energy gap; and
a second plurality of quantum dots having a second energy gap wider than the first energy gap; and
an insulating material that separates at least a portion of each of the plurality of light-emitting devices from others of the plurality of light-emitting devices,
wherein:
a first of the plurality of light-emitting devices is configured to emit light of a first color; and
a second of the plurality of light-emitting devices are configured to emit light of a second color different from the first color.

17. A method for creating a combined charge transport and emissive layer (CCTEL) for a light-emitting device, the method comprising:
depositing a solution over an underlayer of the light-emitting device, the underlayer comprising an electrode, and the solution comprising:
a cross-linkable charge transport material;
a first plurality of quantum dots having a first energy gap; and
a second plurality of quantum dots having a second energy gap wider than the first energy gap; and
applying an activation stimulus to the cross-linkable charge transport material to create a crosslinked charge transport matrix carrying the first plurality of quantum dots and the second plurality of quantum dots.

18. The method of claim 17, wherein the activation stimulus comprises light.

19. The method of claim 17, wherein the first plurality of quantum dots and the second plurality of quantum dots are phase-segregated from the crosslinked charge transport matrix toward a portion of the CCTEL closest to the electrode.

20. The method of claim 17, wherein the first plurality of quantum dots and the second plurality of quantum dots are phase-segregated from the crosslinked charge transport matrix toward a portion of the CCTEL farthest from the electrode.

* * * * *